(12) United States Patent
Kunitani et al.

(10) Patent No.: US 8,262,435 B2
(45) Date of Patent: Sep. 11, 2012

(54) CHEMICAL MECHANICAL POLISHING AQUEOUS DISPERSION, CHEMICAL MECHANICAL POLISHING METHOD, AND CHEMICAL MECHANICAL POLISHING AQUEOUS DISPERSION PREPARATION KIT

(75) Inventors: Eiichirou Kunitani, Kodaira (JP);
Atsushi Baba, Yokkaichi (JP);
Masayuki Motonari, Yokkaichi (JP);
Shoei Tsuji, Mie-gun (JP)

(73) Assignee: JSR Corporation, Tokyo (JP)

( * ) Notice: Subject to any disclaimer, the term of this patent is extended or adjusted under 35 U.S.C. 154(b) by 595 days.

(21) Appl. No.: 12/467,729

(22) Filed: May 18, 2009

(65) Prior Publication Data

US 2009/0291620 A1   Nov. 26, 2009

(30) Foreign Application Priority Data

May 22, 2008   (JP) ................. 2008-133972

(51) Int. Cl.
*B24B 1/00* (2006.01)
(52) U.S. Cl. .......................... 451/28; 451/41
(58) Field of Classification Search .............. 451/28, 451/41, 60, 446; 252/79.1
See application file for complete search history.

(56) References Cited

U.S. PATENT DOCUMENTS

| | | | | |
|---|---|---|---|---|
| 6,740,590 B1* | 5/2004 | Yano et al. | ..................... | 438/692 |
| 6,924,227 B2* | 8/2005 | Minamihaba et al. | ........ | 438/633 |
| 7,060,621 B2* | 6/2006 | Minamihaba et al. | ........ | 438/692 |
| 7,842,191 B2* | 11/2010 | Minamihaba et al. | ....... | 252/79.1 |
| 2004/0261323 A1* | 12/2004 | Minamihaba et al. | .......... | 51/309 |
| 2005/0204638 A1* | 9/2005 | Tamai et al. | .................... | 51/307 |
| 2005/0208883 A1* | 9/2005 | Yoshida et al. | ................. | 451/41 |
| 2006/0186089 A1 | 8/2006 | Shida et al. | | |
| 2006/0201914 A1 | 9/2006 | Uchikura et al. | | |
| 2006/0276041 A1 | 12/2006 | Uchikura et al. | | |
| 2007/0049180 A1* | 3/2007 | Shida et al. | ..................... | 451/41 |
| 2008/0132156 A1* | 6/2008 | Yamato et al. | ................ | 451/287 |
| 2008/0318427 A1 | 12/2008 | Kunitani et al. | | |
| 2009/0124172 A1* | 5/2009 | Uchikura et al. | ............... | 451/36 |
| 2009/0165395 A1 | 7/2009 | Ikeda et al. | | |
| 2009/0221213 A1 | 9/2009 | Namie et al. | | |
| 2009/0302266 A1 | 12/2009 | Takemura et al. | | |
| 2009/0325383 A1 | 12/2009 | Andou et al. | | |
| 2010/0075501 A1 | 3/2010 | Abe et al. | | |
| 2010/0099260 A1 | 4/2010 | Matsumoto et al. | | |
| 2010/0221918 A1 | 9/2010 | Takemura et al. | | |
| 2010/0252774 A1 | 10/2010 | Shida et al. | | |
| 2011/0053462 A1 | 3/2011 | Shida et al. | | |
| 2011/0059680 A1 | 3/2011 | Motonari et al. | | |
| 2011/0081780 A1 | 4/2011 | Shida et al. | | |
| 2011/0117821 A1 | 5/2011 | Nishimoto et al. | | |
| 2011/0250756 A1 | 10/2011 | Uchikura et al. | | |

FOREIGN PATENT DOCUMENTS

| | | |
|---|---|---|
| EP | 1 580 243 A1 | 9/2005 |
| EP | 1 757 665 A1 | 2/2007 |
| JP | 2005-268666 | 9/2005 |
| JP | 2006-80388 | 3/2006 |
| WO | WO 2007/060869 A1 | 5/2007 |

* cited by examiner

*Primary Examiner* — Dung Van Nguyen
(74) *Attorney, Agent, or Firm* — Oblon, Spivak, McClelland, Maier & Neustadt, L.L.P.

(57) ABSTRACT

A chemical mechanical polishing aqueous dispersion includes: (A) an amino acid, (B) abrasive grains, (C) a surfactant, (D) an oxidizing agent, and (E) ammonia, the ratio $(W_A/W_D)$ of the content $(W_A)$ of the amino acid to the content $(W_D)$ of the oxidizing agent being 1.5 to 6.0, and the ratio $(W_E/W_D)$ of the content $(W_E)$ of the ammonia to the content $(W_D)$ of the oxidizing agent being 0.05 to 0.6.

7 Claims, 2 Drawing Sheets

CHEMICAL MECHANICAL POLISHING AQUEOUS DISPERSION, CHEMICAL MECHANICAL POLISHING METHOD, AND CHEMICAL MECHANICAL POLISHING AQUEOUS DISPERSION PREPARATION KIT

Japanese Patent Application No. 2008-133972, filed on May 22, 2008, is hereby incorporated by reference in its entirety.

BACKGROUND OF THE INVENTION

The present invention relates to a chemical mechanical polishing aqueous dispersion, a chemical mechanical polishing method, and a chemical mechanical polishing aqueous dispersion preparation kit.

A copper damascene interconnect provided in a high-performance LSI is formed by chemical mechanical polishing (hereinafter may be referred to as "CMP"). CMP includes a first polishing step of mainly polishing a copper film, and a second polishing step of polishing unnecessary copper, a barrier metal film, and an interlayer dielectric. In the first polishing step, (1) the copper film must be polished at a high speed without substantially polishing the barrier metal film formed of tantalum or titanium, and (2) surface defects (e.g., dishing and corrosion) of the copper film must be suppressed.

In recent years, the first polishing step has been desired to achieve improved flatness in order to deal with a reduction in line width (design rule). Therefore, the first polishing step may be divided into a bulk polishing step and a fine polishing step.

In the bulk polishing step, the deposited copper film is polished at a high speed until immediately before the barrier metal film is exposed. In the bulk polishing step, the copper film must be polished at a high speed while maintaining the flatness of the copper film. Moreover, corrosion and scratches of the copper film must be reduced as much as possible so that the subsequent fine polishing step is affected to a minimum extent.

In the fine polishing step, the copper film that remains unpolished in the bulk polishing step is polished until the barrier metal film is exposed. In the fine polishing step, the copper film must be polished while accurately maintaining the flatness of the copper film, and surface defects (e.g., dishing of the copper film and erosion of the interlayer dielectric) must be suppressed rather than polishing the copper film at a high speed.

A chemical mechanical polishing aqueous dispersion used in the bulk polishing step is desired to polish the copper film at a high speed. For example, JP-A-2005-268666 and JP-A-2006-080388 disclose polishing compositions that can polish the copper film at a high speed. However, when polishing a semiconductor having a minute wiring structure using the polishing composition disclosed in JP-A-2005-268666, the surface of the copper film may be roughened to a large extent, or scratches may occur to a large extent. On the other hand, since the polishing composition disclosed in JP-A-2006-080388 has a copper film polishing rate of 8000 angstroms/min or less, the polishing rate desired for the bulk polishing step cannot be achieved. As a result, the throughput decreases.

As described above, technology that can achieve a high copper film polishing rate desired for the bulk polishing step while forming an excellent polished surface has not been proposed. Therefore, development of a novel chemical mechanical polishing aqueous dispersion has been desired.

SUMMARY

The invention may provide a chemical mechanical polishing aqueous dispersion that can polish a copper film at a speed higher than that of a related-art chemical mechanical polishing aqueous dispersion while suppressing surface defects (e.g., surface roughness and scratches) of the copper film. The invention may also provide a kit for preparing the chemical mechanical polishing aqueous dispersion and a chemical mechanical polishing method using the chemical mechanical polishing aqueous dispersion.

According to a first aspect of the invention, there is provided a chemical mechanical polishing aqueous dispersion comprising: (A) an amino acid, (B) abrasive grains, (C) a surfactant, (D) an oxidizing agent, and (E) ammonia, the ratio $(W_A/W_D)$ of the content $(W_A)$ of the amino acid to the content $(W_D)$ of the oxidizing agent being 1.5 to 6.0, and the ratio $(W_E/W_D)$ of the content $(W_E)$ of the ammonia to the content $(W_D)$ of the oxidizing agent being 0.05 to 0.6.

In the above chemical mechanical polishing aqueous dispersion, the amino acid may be at least one amino acid selected from glycine, alanine, and glutamine.

In the above chemical mechanical polishing aqueous dispersion, the abrasive grains may be colloidal silica or fumed silica.

In the above chemical mechanical polishing aqueous dispersion, the surfactant may be at least one compound selected from potassium dodecylbenzenesulfonate and ammonium dodecylbenzenesulfonate.

In the above chemical mechanical polishing aqueous dispersion, the oxidizing agent may be hydrogen peroxide.

The above chemical mechanical polishing aqueous dispersion may have a pH of 7 to 11.

According to a second aspect of the invention, there is provided a chemical mechanical polishing aqueous dispersion preparation kit comprising a first composition and a second composition used to prepare the above chemical mechanical polishing aqueous dispersion, the first composition including the amino acid (A), the abrasive grains (B), the surfactant (C), and the ammonia (E), and the second composition including the oxidizing agent (D).

According to a third aspect of the invention, there is provided a chemical mechanical polishing aqueous dispersion preparation kit comprising a third composition and a fourth composition used to prepare the above chemical mechanical polishing aqueous dispersion, the third composition including the amino acid (A) and the ammonia (E), the fourth composition including the abrasive grains (B) and the surfactant (C), and at least one of the third composition and the fourth composition further including the oxidizing agent (D).

The fourth composition may further include the ammonia (E).

According to a fourth aspect of the invention, there is provided a chemical mechanical polishing aqueous dispersion preparation kit comprising a fifth composition, a sixth composition, and a seventh composition used to prepare the above chemical mechanical polishing aqueous dispersion, the fifth composition including the amino acid (A) and the ammonia (E), the sixth composition including the abrasive grains (B) and the surfactant (C), and the seventh composition including the oxidizing agent (D).

The sixth composition may further include the ammonia (E).

According to a fifth aspect of the invention, there is provided a chemical mechanical polishing method comprising polishing a copper film formed on a barrier metal film by using the above chemical mechanical polishing aqueous dispersion.

According to the above chemical mechanical polishing aqueous dispersion, the copper film formed on the barrier metal film can be polished at a high speed in the bulk polishing step while suppressing surface defects (e.g., surface roughness and scratches) of the copper film.

According to the above chemical mechanical polishing aqueous dispersion preparation kit, since the components of the chemical mechanical polishing aqueous dispersion can be separately stored as different compositions, the storage stability of each component can be improved. Since the chemical mechanical polishing aqueous dispersion can be prepared by mixing and diluting the compositions before use, a constant polishing performance is necessarily achieved.

DETAILED DESCRIPTION OF THE EMBODIMENT

Figure 1A:
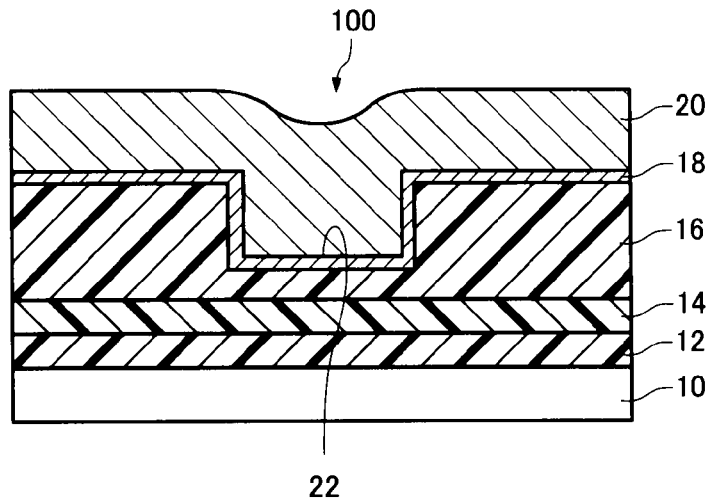
FIGS. 1A to 1C are cross-sectional views schematically illustrating a specific example of a chemical mechanical polishing method.

Some embodiments of the invention are described in detail below.
1. Chemical Mechanical Polishing Aqueous Dispersion A chemical mechanical polishing aqueous dispersion according to one embodiment of the invention includes (A) an amino acid, (B) abrasive grains, (C) a surfactant, (D) an oxidizing agent, and (E) ammonia, the ratio ($W_A/W_D$) of the content ($W_A$) of the amino acid to the content ($W_D$) of the oxidizing agent being 1.5 to 6.0, and the ratio ($W_E/W_D$) of the content ($W_E$) of the ammonia to the content ($W_D$) of the oxidizing agent being 0.05 to 0.6.

Each component of the chemical mechanical polishing aqueous dispersion according to this embodiment is described below.
1.1 Amino Acid (A)

The chemical mechanical polishing aqueous dispersion according to this embodiment includes an amino acid. The amino acid easily forms a coordinate bond with a copper ion. Therefore, the amino acid forms a coordinate bond with the surface of a copper film (i.e., polishing target surface). This ensures that the chemical mechanical polishing aqueous dispersion exhibits an improved affinity with copper and a copper ion so that the polishing rate can be increased, while preventing the surface of the copper film from being roughened to maintain excellent flatness. Moreover, since the amino acid can be easily coordinated with a copper ion dissolved in a slurry when the copper film is polished, precipitation of copper can be prevented. As a result, polishing defects (e.g., scratches) that may occur on the copper film can be suppressed.

Examples of the amino acid include alanine, arginine, asparagine, aspartic acid, cysteine, glutamine, glutamic acid, glycine, histidine, isoleucine, leucine, lysin, methionine, phenylalanine, proline, serine, threonine, tryptophan, thyrosin, valine, and the like. These amino acids may be used either individually or in combination.

It is preferable that the chemical mechanical polishing aqueous dispersion according to this embodiment include at least one amino acid selected from glycine, alanine, and glutamine. It is more preferable that the chemical mechanical polishing aqueous dispersion according to this embodiment include glycine. Glycine, alanine, and glutamine are particularly likely to form a coordinate bond with a copper ion to increase the copper film polishing rate.

The content of the amino acid is preferably 0.5 to 10 mass %, more preferably 1 to 6 mass %, and particularly preferably 2 to 4 mass %, based on the total mass of the chemical mechanical polishing aqueous dispersion. If the content of the amino acid is less than 0.5 mass %, the copper film polishing rate may be insufficient. If the content of the amino acid is more than 10 mass %, dishing of the copper film may occur to a large extent.
1.2 Abrasive Grains (B)

The chemical mechanical polishing aqueous dispersion according to this embodiment includes abrasive grains. The abrasive grains mechanically polish the copper film. Examples of the abrasive grains include inorganic particles and organic-inorganic composite particles.

Examples of the inorganic particles include fumed silica, fumed alumina, and fumed titania synthesized by reacting silicon chloride, aluminum chloride, titanium chloride, or the like with oxygen and hydrogen in a gas phase using a fuming method; silica synthesized by subjecting a metal alkoxide to hydrolysis and condensation using a sol-gel method; high-purity colloidal silica which is synthesized by an inorganic colloid method or the like and from which impurities have been removed by purification; and the like.

The type and the configuration of the organic-inorganic composite particles are not particularly limited insofar as organic particles and inorganic particles are integrally formed to such an extent that the organic particles and the inorganic particles are not easily separated during polishing. Examples of the organic-inorganic composite particles include composite particles obtained by subjecting an alkoxysilane, an aluminum alkoxide, a titanium alkoxide, or the like to polycondensation in the presence of polymer particles (e.g., polystyrene or polymethyl methacrylate) so that a polycondensate (e.g., polysiloxane, polyaluminoxane, or polytitanoxane) is formed on at least the surface of the polymer particles. The polycondensate may be directly bonded to a functional group of the polymer particle, or may be indirectly bonded to a functional group of the polymer particle through a silane coupling agent or the like.

The organic-inorganic composite particles may be formed using the above-mentioned polymer particles and silica particles, alumina particles, titania particles, or the like. In this case, the composite particles may be formed so that silica particles or the like are present on the surface of the polymer particles using a polycondensate (e.g., polysiloxane, polyaluminoxane, or polytitanoxane) as a binder, or may be formed so that functional groups (e.g., hydroxyl groups) of silica particles or the like are chemically bonded to functional groups of the polymer particles. As the organic-inorganic composite particles, composite particles in which organic particles and inorganic particles having zeta potentials of opposite polarities (positive or negative) are bonded by an electrostatic force in an aqueous dispersion containing these particles.

The zeta potential of organic particles is generally negative over the entire pH range or a wide pH range excluding a low pH range. When organic particles have a carboxyl group, a sulfonic acid group, or the like, the organic particles more reliably have a negative zeta potential. When organic particles have an amino group or the like, the organic particles have a positive zeta potential in a given pH range. The zeta potential of inorganic particles has high pH dependence. Inorganic particles have an isoelectric point at which the zeta potential is zero, and the polarity of the zeta potential is reversed across the isoelectric point. Therefore, when mixing specific organic particles and inorganic particles in a pH range in which the organic particles and the inorganic particles have zeta potentials of opposite polarities, the organic particles and the inorganic particles are bonded by an electrostatic force to form composite particles. Even if the organic particles and the inorganic particles have zeta potentials of the same polarity when mixed, the organic particles and the inorganic particles may be bonded by reversing the polarity of the zeta potential of either the organic particles or the inorganic particles (particularly the inorganic particles) by changing the pH of the mixture.

A polycondensate (e.g., polysiloxane, polyaluminoxane, or polytitanoxane) may be formed on at least the surface of the composite particles integrated by an electrostatic force by subjecting an alkoxysilane, an aluminum alkoxide, a titanium alkoxide, or the like to polycondensation in the presence of the composite particles.

The average particle diameter of the abrasive grains is preferably 5 to 1000 nm, more preferably 10 to 700 nm, and particularly preferably 15 to 500 nm. If the average particle diameter of the abrasive grains is within the above range, a stable chemical mechanical polishing aqueous dispersion that achieves a high copper film polishing rate, sufficiently suppresses dishing and erosion, and rarely shows precipitation/separation of the abrasive grains can be obtained. If the average particle diameter of the abrasive grains is less than 5 nm, a chemical mechanical polishing aqueous dispersion that achieves a sufficiently high polishing rate may not be obtained. If the average particle diameter of the abrasive grains is more than 1000 nm, dishing and erosion may not be suppressed sufficiently. Moreover, a stable chemical mechanical polishing aqueous dispersion may not be easily obtained due to precipitation/separation of the abrasive grains. The average particle diameter of the abrasive grains may be measured using a laser scattering diffraction measuring instrument or observation using a transmission electron microscope.

The content of the abrasive grains is preferably 0.01 to 10 mass %, more preferably 0.1 to 5 mass %, and particularly preferably 0.1 to 2 mass %, based on the total mass of the chemical mechanical polishing aqueous dispersion. If the content of the abrasive grains is less than 0.01 mass %, a sufficient polishing rate may not be achieved. If the content of the abrasive grains is more than 10 mass %, cost may increase. Moreover, a stable chemical mechanical polishing aqueous dispersion may not be obtained.

1.3 Surfactant (C)

The chemical mechanical polishing aqueous dispersion according to this embodiment includes a surfactant. The dispersion stability of the abrasive grains can be improved while protecting the surface of the copper film in the bulk polishing step by utilizing the surfactant. Therefore, the copper film can be polished while maintaining the flatness of the copper film so that roughening and scratches of the surface of the copper film can be suppressed.

Examples of the surfactant include an anionic surfactant, a cationic surfactant, and a nonionic surfactant.

Examples of the anionic surfactant include an aliphatic soap, a benzenesulfonate, a sulfate salt, a phosphate salt, and the like. As the benzenesulfonate, potassium dodecylbenzenesulfonate, ammonium dodecylbenzenesulfonate, or the like is preferably used. As the aliphatic soap, potassium oleate or the like is preferably used.

Examples of the cationic surfactant include an aliphatic amine salt, an aliphatic ammonium salt, and the like.

Examples of the nonionic surfactant include a nonionic surfactant having a triple bond, a polyethylene glycol-type surfactant, and the like. Examples of the nonionic surfactant having a triple bond include acetylene glycol, an acetylene glycol ethylene oxide adduct, acetylene alcohol, and the like. Note that polyvinyl alcohol, cyclodextrin, polyvinyl methyl ether, hydroxyethylcellulose, or the like may also be used.

It is preferable to use potassium dodecylbenzenesulfonate or ammonium dodecylbenzenesulfonate from the viewpoint of polishing the copper film in the bulk polishing step while maintaining the flatness of the copper film. These surfactants may be used either individually or in combination.

The content of the surfactant is preferably 0.001 to 5.0 mass %, more preferably 0.01 to 0.5 mass %, and particularly preferably 0.05 to 0.2 mass %, based on the total mass of the chemical mechanical polishing aqueous dispersion.

1.4 Oxidizing Agent (D)

The chemical mechanical polishing aqueous dispersion according to this embodiment includes an oxidizing agent. The oxidizing agent oxidizes the surface of the copper film and promotes a complex-forming reaction with the polishing liquid component to create a brittle modified layer on the surface of the copper film so that the copper film can be easily polished.

Examples of the oxidizing agent include ammonium persulfate, potassium persulfate, hydrogen peroxide, ferric nitrate, cerium diammonium nitrate, iron sulfate, ozone, potassium periodate, peracetic acid, and the like. These oxidizing agents may be used either individually or in combination. Among these oxidizing agents, ammonium persulfate, potassium persulfate, and hydrogen peroxide are particularly preferable from the viewpoint of oxidizing power, compatibility with a protective film, handling capability, and the like.

The content of the oxidizing agent is preferably 0.01 to 10 mass %, more preferably 0.1 to 3 mass %, and particularly preferably 0.5 to 1.5 mass %, based on the total mass of the chemical mechanical polishing aqueous dispersion. If the content of the oxidizing agent is less than 0.01 mass %, the surface of the copper film may not be sufficiently oxidized. As a result, the copper film polishing rate may decrease. If the content of the oxidizing agent is more than 10 mass %, the copper film may be corroded.

1.5 Ammonia (E)

The chemical mechanical polishing aqueous dispersion according to this embodiment includes ammonia. Ammonia forms a chelate with the copper film to increase the polishing rate.

The content of ammonia is preferably 0.01 to 1 mass %, more preferably 0.05 to 0.5 mass %, and particularly preferably 0.1 to 0.3 mass %, based on the total mass of the chemical mechanical polishing aqueous dispersion. If the content of ammonia is less than 0.01 mass %, the copper film polishing rate may be insufficient. If the content of ammonia is more than 1 mass %, the copper film may be corroded, or the surface of the copper film may be roughened.

1.6 Content Ratio

The chemical mechanical polishing aqueous dispersion according to this embodiment enables the copper film to be polished at a speed higher than that achieved using a related-art chemical mechanical polishing aqueous dispersion by specifying the content of the amino acid (A), the oxidizing agent (D), and the ammonia (E). Moreover, the chemical mechanical polishing aqueous dispersion according to this embodiment exhibits excellent planarization characteristics while polishing the copper film at a high speed by specifying the content of the amino acid (A), the oxidizing agent (D), and the ammonia (E), so that surface roughening and scratches rarely occur.

The ratio ($W_A/W_D$) of the content ($W_A$) of the amino acid to the content ($W_D$) of the oxidizing agent is specified for the following reasons.

The surface of the copper film is oxidized due to the oxidizing agent to form copper oxide. It is considered that copper oxide undergoes a complex-forming reaction with the amino acid so that copper is dissolved. Therefore, it is necessary to appropriately control the oxidation reaction of copper due to the oxidizing agent and the complex-forming reaction of copper oxide with the amino acid in order to polish the copper film at a high speed.

Regarding the oxidation reaction of copper due to the oxidizing agent, the amount of copper oxide produced has a correlation with the content of the oxidizing agent. The amount of copper oxide produced can be increased by utilizing a large amount of oxidizing agent. However, since copper oxide cannot be dissolved by merely utilizing a large amount of oxidizing agent, the copper film cannot be polished at a high speed. Specifically, when the content of the oxidizing agent is too high, the amount of copper oxide produced increases. However, since only a small amount of copper undergoes a complex-forming reaction in the presence of a small amount of amino acid, the polishing rate cannot be increased. Moreover, when the content of the oxidizing agent is too high, copper peroxide is produced to hinder the complex-forming reaction of copper with the amino acid so that the polishing rate decreases. Therefore, it is necessary to specify the content of the oxidizing agent. On the other hand, when the content of the oxidizing agent is low, the amount of copper oxide produced decreases so that only a small amount of copper undergoes a complex-forming reaction even in the presence of a large amount of amino acid. As a result, the polishing rate cannot be increased.

Regarding the complex-forming reaction of copper oxide with the amino acid, since the complex-forming reaction of copper oxide with the amino acid has a chemical equilibrium relationship, the reaction is made to proceed in the direction in which a complex is formed by increasing the content of the amino acid so that the copper film polishing rate can be increased. However, when the chemical mechanical polishing aqueous dispersion contains a large amount of amino acid, the abrasive grains aggregate during polishing so that the flatness of the copper film may be impaired. Moreover, when the chemical mechanical polishing aqueous dispersion contains a large amount of amino acid, the abrasive grains aggregate and precipitate during long-term storage so that the storage stability of the chemical mechanical polishing aqueous dispersion may be impaired.

In order to ensure the storage stability of the chemical mechanical polishing aqueous dispersion and polish the copper film at a high speed, the ratio ($W_A/W_D$) of the content ($W_A$) of the amino acid to the content ($W_D$) of the oxidizing agent is 1.5 to 6.0, preferably 2.0 to 5.0, and more preferably 2.0 to 4.0. If the ratio ($W_A/W_D$) is less than 1.5, since the content of the amino acid relatively decreases and the content of the oxidizing agent relatively increases, the balance of the complex-forming reaction is lost. As a result, the copper film cannot be polished at a high speed. Likewise, if the ratio ($W_A/W_D$) is more than 6.0, since the content of the oxidizing agent relatively decreases and the content of the amino acid relatively increases, the balance of the complex-forming reaction is lost. As a result, the copper film cannot be polished at a high speed. Moreover, a deterioration in flatness, surface roughness, and scratches of the copper film occur due to aggregation of the abrasive grains.

The ratio ($W_E/W_D$) of the content ($W_E$) of ammonia to the content ($W_D$) of the oxidizing agent is specified for the following reasons.

Ammonia can directly react with copper instead of copper oxide to form a complex, differing from the amino acid. Ammonia undergoes a complex-forming reaction with copper to increase the copper film polishing rate. However, when using a large amount of ammonia, the surface of the copper film is chemically corroded so that surface roughness and scratches of the copper film occur. Corrosion can be suppressed by increasing the amount of copper oxide produced. However, since the content of the oxidizing agent contributes to the complex-forming reaction of copper oxide with the amino acid, the balance of the complex-forming reaction is lost when merely increasing the content of the oxidizing agent. Therefore, it is necessary to specify the content of ammonia and the oxidizing agent so that corrosion of the copper film due to ammonia can be suppressed without hindering the complex-forming reaction of copper oxide with the amino acid and the copper film polishing rate can be maximized.

In order to obtain an excellent polished surface without surface roughness and scratches and polish the copper film at a high speed, the ratio ($W_E/W_D$) of the content ($W_E$) of ammonia to the content ($W_D$) of the oxidizing agent is 0.05 to 0.6, preferably 0.1 to 0.4, and more preferably 0.1 to 0.2. If the ratio ($W_E/W_D$) is less than 0.05, since the content of ammonia relatively decreases and the content of the oxidizing agent relatively increases, the balance of the complex-forming reaction is lost. As a result, the copper film cannot be polished at a high speed. If the ratio ($W_E/W_D$) is more than 0.6, since the content of ammonia relatively increases and the content of the oxidizing agent relatively decreases, the above-mentioned corrosion reaction cannot be suppressed. As a result, surface roughness and scratches of the copper film occur.

The chemical mechanical polishing aqueous dispersion according to this embodiment achieves the above-described effects by satisfying the above-mentioned two conditions. Specifically, the invention can utilize the chemical polishing effect due to the amino acid based on the complex-forming reaction between copper oxide and the amino acid and the chemical polishing effect due to ammonia based on the complex-forming reaction between copper and ammonia, while maintaining the balance between the chemical polishing effect due to the amino acid and the chemical polishing effect due to ammonia by specifying the above-mentioned content ratios. Therefore, the copper film can be polished at a high speed while forming an excellent polished surface without surface roughness and scratches.

1.7 Other Additives

The chemical mechanical polishing aqueous dispersion according to this embodiment may include the following components (a) to (c), as required.

(a) Complex-forming agent such as phthalic acid, maleic acid, or citric acid (b) Antioxidant such as benzotriazole (c) Water-soluble polymer such as polyacrylic acid or a salt thereof, polymethacrylic acid or a salt thereof, or polyvinylpyrrolidone 1.8 pH The pH of the chemical mechanical polishing aqueous dispersion according to this embodiment is preferably 7 to 11, and more preferably 8 to 10. If the pH of the chemical mechanical polishing aqueous dispersion is less than 7, the copper film may not be polished at a high speed. If the pH of the chemical mechanical polishing aqueous dispersion is more than 11, the surface of the copper film may be roughened, or scratches may occur. Examples of a pH adjusting agent include basic salts such as potassium hydroxide, ethylenediamine, and tetramethylammonium hydroxide (TMAH).

1.9 Application

The chemical mechanical polishing aqueous dispersion according to this embodiment may be used as a polishing agent for chemically and mechanically polishing a copper film that forms an interconnect of a semiconductor device. Specifically, the chemical mechanical polishing aqueous dispersion according to this embodiment may be used as a polishing agent for forming a copper (or copper alloy) damascene interconnect. A process of forming a copper (or copper alloy) damascene interconnect by chemical mechanical polishing includes a first polishing step of mainly removing a copper (or copper alloy) film, and a second polishing step of mainly removing a conductive barrier metal film formed under copper (or copper alloy). The chemical mechanical polishing aqueous dispersion according to this embodiment is effectively used in the first polishing step.

The first polishing step may be divided into a step of polishing the deposited copper film at a high speed until immediately before the barrier metal film is exposed (bulk polishing step), and a step of polishing the copper film that remains unpolished in the bulk polishing step until the barrier metal film is exposed (fine polishing step). The chemical mechanical polishing aqueous dispersion according to this embodiment is effectively used in the bulk polishing step since the chemical mechanical polishing aqueous dispersion according to this embodiment can polish the copper film at a high speed while maintaining the flatness of the copper film.

2. Chemical Mechanical Polishing Method

A specific example of a chemical mechanical polishing method according to one embodiment of the invention is described in detail below with reference to the drawings.

Figure 1B:
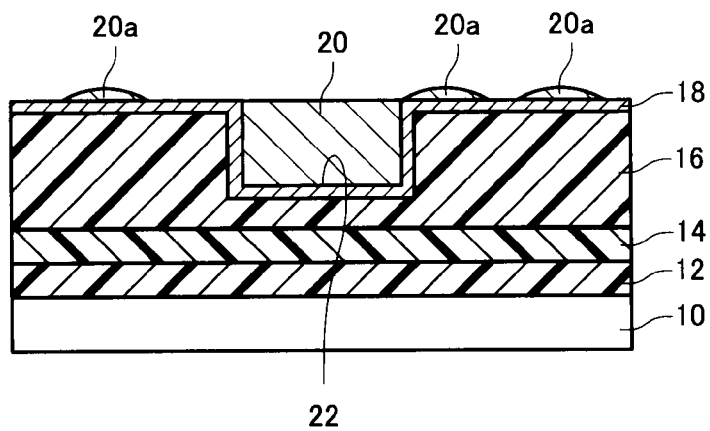
Figure 1C:
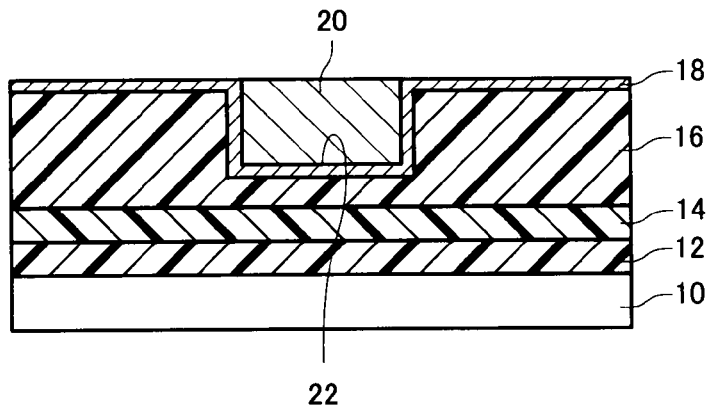

FIGS. 1A to 1C are cross-sectional views schematically showing a specific example of the chemical mechanical polishing method according to this embodiment.

2.1 Polishing Target

FIG. 1A shows a polishing target 100. As shown in FIG. 1A, the polishing target 100 includes a substrate 10. The substrate 10 includes at least a semiconductor substrate (not shown). The substrate 10 may include a silicon substrate and a silicon oxide film formed on the silicon substrate, for example. A functional device such as a transistor may be formed on the semiconductor substrate included in the substrate 10.

The polishing target 100 includes an insulating film 12 (e.g., silicon oxide) formed on the substrate 10, an insulating film 14 (e.g., silicon nitride) formed on the insulating film 12, an insulating film 16 that is formed on the insulating film 14 and has an interconnect depression 22, a barrier metal film 18 that is formed to cover the surface of the insulating film 16 and the bottom and the inner wall surface of the interconnect depression 22, and a copper film 20 that is formed on the barrier metal film 18 so that the interconnect depression 22 is filled with the copper film 20.

The insulating film 16 may be a silicon oxide film formed by a vacuum process (e.g., plasma enhanced-TEOS film (PE-TEOS film), a high-density plasma enhanced-TEOS film (HDP film), or a silicon oxide film obtained by thermal chemical vapor deposition), an insulating film referred to as fluorine-doped silicate glass (FSG), a borophosphosilicate film (BPSG film), an insulating film referred to as silicon oxynitride (SiON), silicon nitride, a low-dielectric-constant insulating film, or the like.

The barrier metal film 18 may be formed of tantalum, tantalum nitride, titanium, titanium nitride, a tantalum-niobium alloy, or the like. The barrier metal film 18 is generally formed of one of these materials, but may be formed of two or more of these materials (e.g., tantalum and tantalum nitride).

As shown in FIG. 1A, the interconnect depression 22 must be completely filled with the copper film 20. Therefore, a copper film having a thickness of 10,000 to 15,000 angstroms is normally deposited by chemical vapor deposition or electroplating. As the material for the copper film 20, a copper alloy may be used instead of pure copper. The copper content of the copper alloy is preferably 95 mass % or more.

2.2 Polishing Step

In the first polishing step, the copper film 20 of the polishing target 100 is polished using the chemical mechanical polishing aqueous dispersion. The first polishing step may be divided into a step of polishing the deposited copper film at a high speed until immediately before the barrier metal film is exposed (bulk polishing step), and a step of polishing the copper film that remains unpolished in the bulk polishing step until the barrier metal film is exposed (fine polishing step), as described above. The chemical mechanical polishing aqueous dispersion according to this embodiment is effectively used in the bulk polishing step since the chemical mechanical polishing aqueous dispersion according to this embodiment can polish the copper film at a high speed while maintaining the flatness of the copper film.

As shown in FIG. 1B, the copper film 20 provided in an area other than the interconnect depression 22 is polished at a high speed using the chemical mechanical polishing aqueous dispersion until immediately before the barrier metal film 18 is exposed (bulk polishing step). In this case, the copper film polishing rate is preferably 15,000 angstroms/min or more, and more preferably 20,000 angstroms/min or more. Therefore, the throughput of semiconductor device production can be increased.

As shown in FIG. 1C, a copper film 20a that remains unpolished in the bulk polishing step is polished until the barrier metal film 18 is exposed using another chemical mechanical polishing aqueous dispersion that does not achieve a high copper film polishing rate, but can accurately maintain flatness (fine polishing step). The first polishing step is completed by completing the fine polishing step. Note that the state shown in FIG. 1C may be achieved by the bulk polishing step without performing the fine polishing step. In this case, the fine polishing step is unnecessary.

Figure 2:
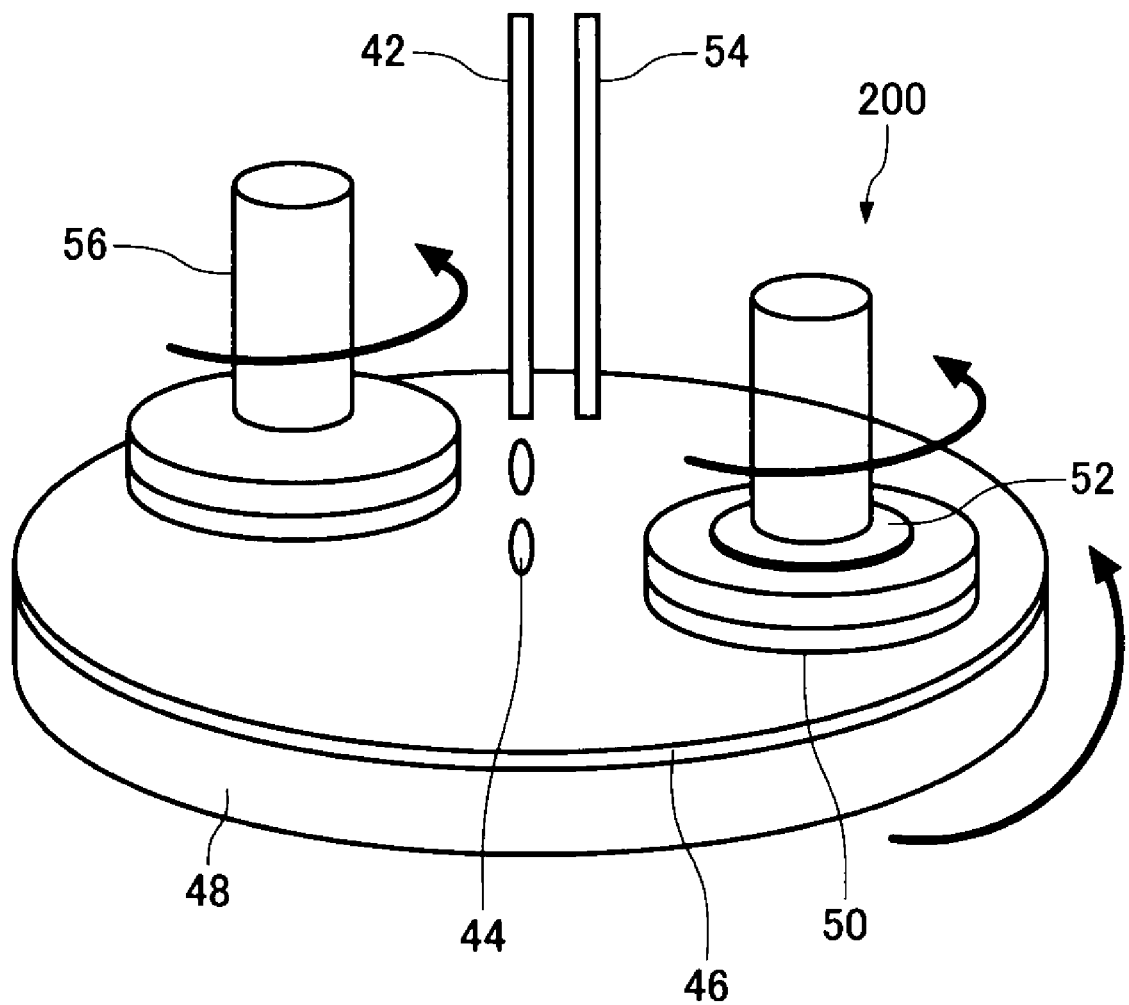
FIG. 2 is a perspective view schematically illustrating a chemical mechanical polishing apparatus.

A chemical mechanical polishing apparatus 200 shown in FIG. 2 may be used in the first polishing step, for example. FIG. 2 is a schematic view showing the chemical mechanical polishing apparatus 200. A carrier head 52 that holds a semiconductor substrate 50 is caused to come in contact with a turntable 48 to which an abrasive cloth 46 is attached while supplying a slurry 44 from a slurry supply nozzle 42 and rotating the turntable 48. FIG. 2 also shows a water supply nozzle 54 and a dresser 56.

The polishing load of the carrier head 52 may be selected within the range of 10 to 1,000 gf/cm$^2$, and is preferably 30 to 500 gf/cm$^2$. The rotational speed of the turntable 48 and the carrier head 52 may be appropriately selected within the range of 10 to 400 rpm, and is preferably 30 to 150 rpm. The flow rate of the slurry 44 supplied from the slurry supply nozzle 42 may be selected within the range of 10 to 1000 cm$^3$/min, and is preferably 50 to 400 cm$^3$/min.

In the first polishing step, a commercially available chemical mechanical polishing apparatus may be used. Examples of a commercially available chemical mechanical polishing apparatus include "EPO-112", "EPO-222" (manufactured by Ebara Corporation), "LGP510", "LGP552" (manufactured by Lapmaster SFT Corporation), "Mirra" (manufactured by Applied Materials, Inc.), and the like.

3. Chemical Mechanical Polishing Aqueous Dispersion Preparation Kit

The chemical mechanical polishing aqueous dispersion may be supplied in a state in which the chemical mechanical polishing aqueous dispersion can be directly used as a polishing composition after preparation. Alternatively, a polishing composition containing each component of the chemical mechanical polishing aqueous dispersion at a high concentration (i.e. concentrated polishing composition) may be provided, and the concentrated polishing composition may be diluted before use to obtain a desired chemical mechanical polishing aqueous dispersion.

Alternatively, a plurality of compositions (e.g., two or three compositions) respectively containing at least one of the above components may be provided and mixed before use. In this case, a chemical mechanical polishing aqueous dispersion may be prepared by mixing a plurality of liquids, and supplied to the chemical mechanical polishing apparatus. Alternatively, a plurality of liquids may be individually supplied to the chemical mechanical polishing apparatus, and a chemical mechanical polishing aqueous dispersion may be prepared on the platen. For example, the chemical mechanical polishing aqueous dispersion may be prepared by mixing a plurality of liquids using the following first to third kits.

3.1 First Kit

The first kit according to this embodiment is used to prepare the chemical mechanical polishing aqueous dispersion by mixing a first composition and a second composition, the first composition including the amino acid (A), the abrasive grains (B), the surfactant (C), the ammonia (E), and water, and the second composition including the oxidizing agent (D) and water.

The concentration of each component of the first composition and the second composition is not particularly limited insofar as the concentration of each component of the chemical mechanical polishing aqueous dispersion prepared by mixing the first composition and the second composition falls within the above-mentioned range. For example, the first composition and the second composition are prepared to contain each component at a concentration higher than that of the chemical mechanical polishing aqueous dispersion, optionally diluted before use, and then mixed to obtain a chemical mechanical polishing aqueous dispersion in which the concentration of each component falls within the above-mentioned range. Specifically, when mixing the first composition and the second composition in a mass ratio of 1:1, the first composition and the second composition are prepared so that the concentration of each component is twice that of the chemical mechanical polishing aqueous dispersion. Alternatively, the first composition and the second composition may be prepared so that the concentration of each component is equal to or more than twice that of the chemical mechanical polishing aqueous dispersion, mixed in a mass ratio of 1:1, and the mixture may be diluted with water so that each component is contained at the desired concentration.

According to the first kit, the storage stability of the oxidizing agent included in the second composition can be improved by separately preparing and storing the first composition and the second composition.

When using the first kit, the mixing method and the mixing timing of the first composition and the second composition are not particularly limited insofar as the chemical mechanical polishing aqueous dispersion has been prepared when polishing the polishing target. For example, the chemical mechanical polishing aqueous dispersion prepared by mixing the first composition and the second composition may be supplied to the chemical mechanical polishing apparatus, or the first composition and the second composition may be individually supplied to the chemical mechanical polishing apparatus, and mixed on the platen. Alternatively, the first composition and the second composition may be individually supplied to the chemical mechanical polishing apparatus, and mixed in a line of the chemical mechanical polishing apparatus, or mixed in a mixing tank provided in the chemical mechanical polishing apparatus. A line mixer or the like may be used to obtain a more uniform aqueous dispersion.

3.2 Second Kit

The second kit according to this embodiment is used to prepare the chemical mechanical polishing aqueous dispersion by mixing a third composition and a fourth composition, the third composition including the amino acid (A), the ammonia (E), and water, and the fourth composition including the abrasive grains (B), the surfactant (C), and water. The oxidizing agent (D) is included in at least one of the third composition and the fourth composition. The fourth composition may also include the ammonia (E).

According to the second kit, the storage stability of the abrasive grains included in the fourth composition can be improved by separately preparing and storing the third composition and the fourth composition. The second kit is prepared and used in the same manner as the first kit.

3.3 Third Kit

The third kit according to this embodiment is used to prepare the chemical mechanical polishing aqueous dispersion by mixing a fifth composition, a sixth composition, and a seventh composition, the fifth composition including the amino acid (A), the ammonia (E), and water, the sixth composition including the abrasive grains (B), the surfactant (C), and water, and the seventh composition including the oxidizing agent (D) and water. The sixth composition may also include the ammonia (E).

According to the third kit, the storage stability of the abrasive grains included in the sixth composition and the oxidizing agent included in the seventh composition can be improved by separately preparing and storing the fifth composition, the sixth composition, and the seventh composition. The third kit is prepared and used in the same manner as the first kit.

4. Examples

The invention is further described below by way of examples. Note that the invention is not limited to the following examples.

4.1. Preparation of Aqueous Dispersion Containing Abrasive Grains

4.1.1 Preparation of Aqueous Dispersion Containing Colloidal Silica Particles A flask was charged with 70 parts by mass of 25 mass % aqueous ammonia, 40 parts by mass of ion-exchanged water, 170 parts by mass of ethanol, and 20 parts by mass of tetraethoxysilane. The mixture was heated to 60° C. with stirring at a rotational speed of 180 rpm. After stirring the mixture at 60° C., the mixture was cooled to room temperature to obtain an alcohol dispersion of colloidal silica particles.

An operation of removing the alcohol from the dispersion using a rotary evaporator while adding ion-exchanged water was repeated several times. The alcohol was removed by this operation to obtain an aqueous dispersion C1 containing 20 mass % of colloidal silica particles. The average primary particle diameter of the colloidal silica particles contained in the aqueous dispersion C1 determined using a transmission electron microscope (TEM) ("H-7500" manufactured by Hitachi Ltd.) was 25 nm. The average secondary particle diameter of the colloidal silica particles determined using a dynamic light scattering particle size analyzer ("HORIBA LB550" manufactured by Horiba Ltd.) was 50 nm. An aqueous dispersion C2 containing 20 mass % of colloidal silica particles (average primary particle diameter: 35 nm, average secondary particle diameter: 90 nm) and an aqueous dispersion C3 containing 20 mass % of colloidal silica particles (average primary particle diameter: 35 nm, average secondary particle diameter: 70 nm) were prepared in the same manner as described above, except for changing the amounts of aqueous ammonia, ethanol, and tetraethoxysilane and the temperature employed during stirring.

4.1.2 Preparation of Aqueous Dispersion Containing Fumed Silica Particles 2 kg of fumed silica particles ("Aerosil #90" manufactured by Nippon Aerosil Co., Ltd., average primary particle diameter: 20 nm) were dispersed in 6.7 kg of ion-exchanged water using an ultrasonic mixer. The mixture was filtered through a filter having a pore diameter of 5 micrometers to obtain an aqueous dispersion F1 containing 23 mass % of the fumed silica particles. The average secondary particle diameter of the fumed silica contained in the aqueous dispersion was 220 nm.

4.2 Preparation of Chemical Mechanical Polishing Aqueous Dispersion 4.2.1 Preparation of Chemical Mechanical Polishing Aqueous Dispersion A 3.9 mass % (the total mass of the chemical mechanical polishing aqueous dispersion=100 mass %) of glycine, 0.1 mass % of alanine, 0.5 mass % (solid content) of the colloidal silica aqueous dispersion C1, 0.3 mass % of ammonium dodecylbenzenesulfonate, 1.0 mass % of ammonia, and ion-exchanged water in such an amount that the total amount of the components was 100 mass %, were mixed and stirred for one hour. The mixture was filtered through a filter having a pore diameter of 5 micrometers. The pH of the mixture was then adjusted to 9.7 using KOH. A 30 mass % hydrogen peroxide solution in an amount corresponding to 1.75 mass % of hydrogen peroxide was then added to the mixture to obtain a chemical mechanical polishing aqueous dispersion A shown in Table 1. The content of each component shown in Table 1 is indicated in mass %. The component other than the components shown in Table 1 is water. "DBS-A" shown in Tables 1 to 3 indicates ammonium dodecylbenzenesulfonate.

4.2.2 Preparation of Chemical Mechanical Polishing Aqueous Dispersions B to S

Chemical mechanical polishing aqueous dispersions B to S were prepared in the same manner as the chemical mechanical polishing aqueous dispersion A, except for changing the type of amino acid and the components as shown in Tables 1 to 3. "DBS-K" shown in Tables 1 to 3 indicates potassium dodecylbenzenesulfonate.

4.3 Examples 1 to 6 and Comparative Examples 1 to 13

4.3.1 Evaluation of Copper Film Polishing Rate

A porous polyurethane polishing pad ("IC1000" manufactured by Nitta Haas Inc.) was installed in a chemical mechanical polishing apparatus ("Mirra" manufactured by Applied Materials, Inc.). A polishing rate measurement substrate was polished for 30 seconds under the following polishing conditions while supplying one of the chemical mechanical polishing aqueous dispersions A to S. The polishing rate was calculated by the following method.

Polishing Rate Measurement Substrate
  Eight-inch silicon substrate with thermal oxide film on which a copper film having a thickness of 15,000 angstroms was formed Polishing Conditions
  Head rotational speed: 100 rpm
  Platen rotational speed: 100 rpm
  Head load: 3.5 psi
  Supply rate of chemical mechanical polishing aqueous dispersion: 200 ml/min The term "supply rate of the chemical mechanical polishing aqueous dispersion" refers to the total amount of the chemical mechanical polishing aqueous dispersion supplied per unit time.

Calculation of Polishing Rate

The thickness of the copper film was measured before and after polishing using an electric conduction type thickness measurement device ("OmniMap RS75" manufactured by KLA-Tencor Corporation). The polishing rate was calculated from a reduction in thickness due to polishing and the polishing time. The results are shown in Tables 1 to 3.

A case where the copper film polishing rate was 15,000 angstroms/min or more is indicated by "Good". A case where the copper film polishing rate was 20,000 angstroms/min or more is indicated by "Excellent". A case where the copper film polishing rate was less than 15,000 angstroms/min is indicated by "Bad" (i.e., cannot be applied to an actual device).

4.3.2 Evaluation of Copper Film Polishing Performance

The polishing rate measurement substrate was subjected to chemical mechanical polishing under the polishing conditions described in "4.3.1 Evaluation of copper film polishing rate". The surface roughness and scratches of the copper film were evaluated by the following methods.

Evaluation of Surface Roughness

The surface roughness of the copper film was measured using a noncontact three-dimensional optical profiler ("NewView 5032" manufactured by Zygo). The results are shown in Tables 1 to 3. A case where the surface roughness of the copper film was 10 nm or less is indicated by "Good". A case where the surface roughness of the copper film was 5 nm or less is indicated by "Excellent". A case where the surface roughness of the copper film was more than 10 nm is indicated by "Bad" (i.e., cannot be applied to an actual device).

Evaluation of Scratches

The presence or absence of scratches was evaluated by dark field observation using an optical microscope ("MX-50" manufactured by Olympus Corporation). The results are shown in Tables 1 to 3. A case where no scratches were observed is indicated by "Good", a case where some scratches were observed is indicated by "Fair", and a case where a large number of scratches were observed is indicated by "Bad".

TABLE 1

| | Example 1 | | Example 2 | | Example 3 | |
|---|---|---|---|---|---|---|
| | Chemical mechanical polishing aqueous dispersion | | | | | |
| | A | | B | | C | |
| | Component | mass % | Component | mass % | Component | mass % |
| Amino acid (A) | Glycine | 3.90 | Glycine | 3.84 | Glycine | 2.58 |
| | Alanine | 0.10 | | | Alanine | 2.10 |

TABLE 1-continued

| | | | | | | | |
|---|---|---|---|---|---|---|---|
| Abrasive grains (B) | | C1 | 0.50 | C3 | 0.60 | C2 | 0.35 |
| Surfactant (C) | | DBS-A | 0.30 | DBS-K | 0.20 | DBS-A | 0.10 |
| Oxidizing agent (D) | | Hydrogen peroxide | 1.75 | Hydrogen peroxide | 1.30 | Hydrogen peroxide | 0.90 |
| Ammonia (E) | | Ammonia | 1.00 | Ammonia | 0.25 | Ammonia | 0.16 |
| Content ratio ($W_A/W_D$) | | 2.23 | | 2.95 | | 5.20 | |
| Content ratio ($W_E/W_D$) | | 0.57 | | 0.19 | | 0.18 | |
| pH | | 9.7 | | 9.0 | | 9.1 | |
| Polishing rate evaluation | Copper film polishing rate (angstroms/min) | 19071 | | 22612 | | 19875 | |
| | Evaluation | Good | | Excellent | | Good | |
| Surface roughness evaluation | Surface roughness (nm) | 6.5 | | 2.7 | | 8.2 | |
| | Evaluation | Good | | Excellent | | Good | |
| Scratch evaluation | Number of scratches per wafer | 0 | | 0 | | 0 | |
| | Evaluation | Good | | Good | | Good | |

| | | Example 4 | | Example 5 | | Example 6 | |
|---|---|---|---|---|---|---|---|
| | | Chemical mechanical polishing aqueous dispersion | | | | | |
| | | D | | E | | F | |
| | | Component | mass % | Component | mass % | Component | mass % |
| Amino acid (A) | | Glycine | 4.00 | Glycine | 2.00 | Glycine | 3.40 |
| | | Glutamine | 1.20 | | | | |
| Abrasive grains (B) | | C2 | 0.50 | F1 | 0.30 | C1 | 0.35 |
| Surfactant (C) | | DBS-K | 0.16 | DBS-A | 0.18 | DBS-A | 0.18 |
| Oxidizing agent (D) | | Hydrogen peroxide | 1.40 | Hydrogen peroxide | 0.72 | Hydrogen peroxide | 2.22 |
| Ammonia (E) | | Ammonia | 0.43 | Ammonia | 0.12 | Ammonia | 0.80 |
| Content ratio ($W_A/W_D$) | | 3.71 | | 2.78 | | 1.53 | |
| Content ratio ($W_E/W_D$) | | 0.31 | | 0.17 | | 0.36 | |
| pH | | 9.0 | | 9.0 | | 9.6 | |
| Polishing rate evaluation | Copper film polishing rate (angstroms/min) | 21435 | | 17576 | | 15690 | |
| | Evaluation | Excellent | | Good | | Good | |
| Surface roughness evaluation | Surface roughness (nm) | 1.6 | | 2.3 | | 7.9 | |
| | Evaluation | Excellent | | Excellent | | Good | |
| Scratch evaluation | Number of scratches per wafer | 0 | | 0 | | 0 | |
| | Evaluation | Good | | Good | | Good | |

TABLE 2

| | | Comparative Example 1 | | Comparative Example 2 | | Comparative Example 3 | |
|---|---|---|---|---|---|---|---|
| | | Chemical mechanical polishing aqueous dispersion | | | | | |
| | | G | | H | | I | |
| | | Component | mass % | Component | mass % | Component | mass % |
| Amino acid (A) | | Glycine | 1.50 | Glycine | 0.75 | — | |
| | | Glutamine | 0.23 | Alanine | 0.10 | — | |
| Abrasive grains (B) | | C2 | 0.50 | C1 | 0.30 | C3 | 0.30 |
| Surfactant (C) | | DBS-K | 0.30 | DBS-A | 0.20 | DBS-A | 0.20 |
| Oxidizing agent (D) | | Hydrogen peroxide | 0.20 | Hydrogen peroxide | 1.90 | Hydrogen peroxide | 2.00 |
| Ammonia (E) | | Ammonia | 0.80 | Ammonia | 1.10 | Ammonia | 0.93 |
| Content ratio ($W_A/W_D$) | | 8.65 | | 0.45 | | 0.00 | |
| Content ratio ($W_E/W_D$) | | 4.00 | | 0.58 | | 0.47 | |
| pH | | 9.9 | | 10.2 | | 10.4 | |
| Polishing rate evaluation | Copper film polishing rate (angstroms/min) | 14865 | | 8472 | | 9230 | |
| | Evaluation | Bad | | Bad | | Bad | |

TABLE 2-continued

| | | | | |
|---|---|---|---|---|
| Surface roughness evaluation | Surface roughness (nm) | 7.9 | 27.1 | 22.2 |
| | Evaluation | Good | Bad | Bad |
| Scratch evaluation | Number of scratches per wafer | >100 | 40 | 50 |
| | Evaluation | Bad | Bad | Bad |

| | | Comparative Example 4 | | Comparative Example 5 | | Comparative Example 6 | |
|---|---|---|---|---|---|---|---|
| | | Chemical mechanical polishing aqueous dispersion | | | | | |
| | | J | | K | | L | |
| | | Component | mass % | Component | mass % | Component | mass % |
| Amino acid (A) | | Glycine | 0.75 | Glycine | 0.75 | Glycine | 2.20 |
| | | | | Alanine | 2.50 | | |
| Abrasive grains (B) | | C3 | 0.50 | C1 | 0.40 | C2 | 0.40 |
| Surfactant (C) | | DBS-K | 0.15 | DBS-A | 0.12 | DBS-A | 0.20 |
| Oxidizing agent (D) | | Hydrogen peroxide | 1.20 | Hydrogen peroxide | 2.00 | Hydrogen peroxide | 0.70 |
| Ammonia (E) | | Ammonia | 2.00 | Ammonia | 1.40 | — | — |
| Content ratio ($W_A/W_D$) | | 0.63 | | 1.63 | | 3.14 | |
| Content ratio ($W_E/W_D$) | | 1.67 | | 0.70 | | 0.00 | |
| pH | | 10.5 | | 10.5 | | 6.9 | |
| Polishing rate evaluation | Copper film polishing rate (angstroms/min) | 13560 | | 9234 | | 3200 | |
| | Evaluation | Bad | | Bad | | Bad | |
| Surface roughness evaluation | Surface roughness (nm) | 5.6 | | 31.2 | | 3.2 | |
| | Evaluation | Good | | Bad | | Excellent | |
| Scratch evaluation | Number of scratches per wafer | 20 | | 33 | | 0 | |
| | Evaluation | Bad | | Bad | | Good | |

TABLE 3

| | | Comparative Example 7 | | Comparative Example 8 | | Comparative Example 9 | | Comparative Example 10 | |
|---|---|---|---|---|---|---|---|---|---|
| | | Chemical mechanical polishing aqueous dispersion | | | | | | | |
| | | M | | N | | O | | P | |
| | | Component | mass % | Component | mass % | Component | mass % | Component | mass % |
| Amino acid (A) | | Glycine | 0.80 | Glycine | 1.30 | Glycine | 0.35 | Glycine | 0.20 |
| | | | | Glutamine | 0.30 | | | | |
| Organic acid other than amino acid | | | | | | | | | |
| Abrasive grains (B) | | C1 | 0.40 | C2 | 0.30 | C1 | 0.40 | C3 | 0.20 |
| Surfactant (C) | | DBS-K | 0.12 | DBS-A | 0.12 | DBS-A | 0.15 | DBS-A | 0.30 |
| Oxidizing agent (D) | | Hydrogen peroxide | 0.20 | Hydrogen peroxide | 0.25 | Hydrogen peroxide | 0.50 | Hydrogen peroxide | 0.60 |
| Ammonia (E) | | Ammonia | 0.003 | Ammonia | 0.10 | Ammonia | 0.13 | Ammonia | 0.01 |
| Basic compound other than ammonia | | | | | | | | | |
| Content ratio ($W_A/W_D$) | | 4.00 | | 6.40 | | 0.70 | | 0.33 | |
| Content ratio ($W_E/W_D$) | | 0.015 | | 0.40 | | 0.26 | | 0.017 | |
| pH | | 8.2 | | 8.9 | | 8.9 | | 9.1 | |
| Polishing rate evaluation | Copper film polishing rate (angstroms/min) | 8230 | | 13420 | | 4530 | | 3080 | |
| | Evaluation | Bad | | Bad | | Bad | | Bad | |
| Surface roughness evaluation | Surface roughness (nm) | 9.8 | | 12.5 | | 5.6 | | 5.6 | |
| | Evaluation | Good | | Bad | | Good | | Good | |
| Scratch evaluation | Number of scratches per wafer | 5 | | 1 | | 1 | | 0 | |
| | Evaluation | Fair | | Fair | | Fair | | Good | |

TABLE 3-continued

| | | Comparative Example 11 | | Comparative Example 12 | | Comparative Example 13 | |
|---|---|---|---|---|---|---|---|
| | | Chemical mechanical polishing aqueous dispersion | | | | | |
| | | Q | | R | | S | |
| | | Component | mass % | Component | mass % | Component | mass % |
| Amino acid (A) | | Glycine | 0.50 | | | Glycine | 2.10 |
| | | Alanine | 1.00 | | | | |
| Organic acid other than amino acid | | | | Citric acid | 2.20 | | |
| Abrasive grains (B) | | C3 | 0.18 | C1 | 0.50 | C3 | 0.10 |
| Surfactant (C) | | DBS-A | 0.15 | DBS-A | 0.12 | DBS-K | 0.20 |
| Oxidizing agent (D) | | Hydrogen peroxide | 0.20 | Hydrogen peroxide | 0.90 | Hydrogen peroxide | 0.85 |
| Ammonia (E) | | Ammonia | 0.008 | Ammonia | 0.40 | — | |
| Basic compound other than ammonia | | | | | | Potassium hydroxide | 0.18 |
| Content ratio ($W_A/W_D$) | | 7.50 | | 2.44 | | 2.47 | |
| Content ratio ($W_E/W_D$) | | 0.04 | | 0.44 | | 0.21 | |
| pH | | 8.8 | | 5.2 | | 9.0 | |
| Polishing rate evaluation | Copper film polishing rate (angstroms/min) | 7360 | | 2260 | | 8240 | |
| | Evaluation | Bad | | Bad | | Bad | |
| Surface roughness evaluation | Surface roughness (nm) | 10.5 | | 10.9 | | 2.5 | |
| | Evaluation | Bad | | Bad | | Excellent | |
| Scratch evaluation | Number of scratches per wafer | 0 | | 2 | | 0 | |
| | Evaluation | Good | | Fair | | Good | |

4.4 Evaluation Results

When using the chemical mechanical polishing aqueous dispersions of Examples 1 to 6, the copper film polishing rate was sufficiently high (15,000 angstroms/min or more). When using the chemical mechanical polishing aqueous dispersion of Example 2 or 4, the copper film polishing rate was as high as 20,000 angstroms/min or more. When using the chemical mechanical polishing aqueous dispersions of Examples 1 to 6, the surface roughness of the copper film was suppressed to 10 nm or less, and scratches of the copper film were not observed.

The content ratio ($W_A/W_D$) and the content ratio ($W_E/W_D$) of the chemical mechanical polishing aqueous dispersion of Comparative Example 1 were more than the specified ranges. As a result, the copper film polishing rate decreased to some extent, and a large number of scratches were observed on the surface of the copper film.

The content ratio ($W_A/W_D$) of the chemical mechanical polishing aqueous dispersion of Comparative Example 2 was less than the specified range. As a result, the copper film polishing rate decreased to a large extent. Moreover, the surface roughness of the copper film increased, and a large number of scratches were observed.

Since the chemical mechanical polishing aqueous dispersion of Comparative Example 3 did not contain the amino acid, the copper film polishing rate decreased to a large extent. Moreover, the surface roughness of the copper film increased, and a large number of scratches were observed.

The chemical mechanical polishing aqueous dispersion of Comparative Example 4 had a content ratio ($W_A/W_D$) less than the specified range, and a content ratio ($W_E/W_D$) more than the specified range. As a result, the copper film polishing rate decreased to some extent, and a large number of scratches were observed on the surface of the copper film.

The content ratio ($W_E/W_D$) of the chemical mechanical polishing aqueous dispersion of Comparative Example 5 was more than the specified range. As a result, the copper film polishing rate decreased to a large extent. Moreover, the surface roughness of the copper film increased, and a large number of scratches were observed.

The chemical mechanical polishing aqueous dispersion of Comparative Example 6 did not contain ammonia and had a pH of 7 or less. As a result, the copper film polishing rate decreased to a large extent.

The content ratio ($W_E/W_D$) of the chemical mechanical polishing aqueous dispersion of Comparative Example 7 was less than the specified range. As a result, the copper film polishing rate decreased to a large extent, and some scratches were observed.

The content ratio ($W_A/W_D$) of the chemical mechanical polishing aqueous dispersion of Comparative Example 8 was more than the specified range. As a result, the copper film polishing rate decreased to some extent, and some scratches were observed.

The content ratio ($W_A/W_D$) of the chemical mechanical polishing aqueous dispersion of Comparative Example 9 was less than the specified range. As a result, the copper film polishing rate decreased to a large extent, and some scratches were observed.

The content ratio ($W_A/W_D$) and the content ratio ($W_E/W_D$) of the chemical mechanical polishing aqueous dispersion of Comparative Example 10 were less than the specified ranges. As a result, the copper film polishing rate decreased to a large extent.

The chemical mechanical polishing aqueous dispersion of Comparative Example 11 had a content ratio ($W_A/W_D$) more than the specified range, and a content ratio ($W_E/W_D$) less than the specified range. As a result, the copper film polishing rate decreased to a large extent, and the surface of the copper film was roughened to a large extent.

The chemical mechanical polishing aqueous dispersion of Comparative Example 12 contained an organic acid (citric acid) other than the amino acid instead of the amino acid, and had a pH of 7 or less. As a result, the copper film polishing rate decreased to a large extent, and the surface of the copper film was roughened to a large extent.

The chemical mechanical polishing aqueous dispersion of Comparative Example 13 contained a basic compound (potassium hydroxide) other than ammonia instead of ammonia. As a result, the copper film polishing rate decreased to a large extent.

As described above, the copper film could be polished at a high speed while suppressing surface defects (e.g., surface roughness and scratches) of the polishing target surface by utilizing the chemical mechanical polishing aqueous dispersion in which the ratio ($W_A/W_D$) of the content ($W_A$) of the amino acid to the content ($W_D$) of the oxidizing agent was 1.5 to 6.0 and the ratio ($W_E/W_D$) of the content ($W_E$) of the ammonia to the content ($W_D$) of the oxidizing agent was 0.05 to 1.0. Therefore, the copper film polishing rate could be increased while uniformly removing the surface of the copper film by chemical mechanical polishing.

Although only some embodiments of this invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A chemical mechanical polishing aqueous dispersion comprising:
    (A) an amino acid, (B) abrasive grains, (C) a surfactant, (D) an oxidizing agent, and (E) ammonia, the ratio ($W_A/W_D$) of the content ($W_A$) of the amino acid to the content ($W_D$) of the oxidizing agent being 1.5 to 6.0, and the ratio ($W_E/W_D$) of the content ($W_E$) of the ammonia to the content ($W_D$) of the oxidizing agent being 0.05 to 0.6.

2. The chemical mechanical polishing aqueous dispersion according to claim 1, wherein the amino acid is at least one amino acid selected from glycine, alanine, and glutamine.

3. The chemical mechanical polishing aqueous dispersion according to claim 1, wherein the abrasive grains are colloidal silica or fumed silica.

4. The chemical mechanical polishing aqueous dispersion according to claim 1, wherein the surfactant is at least one compound selected from potassium dodecylbenzenesulfonate and ammonium dodecylbenzenesulfonate.

5. The chemical mechanical polishing aqueous dispersion according to claim 1, wherein the oxidizing agent is hydrogen peroxide.

6. The chemical mechanical polishing aqueous dispersion according to claim 1, the chemical mechanical polishing aqueous dispersion having a pH of 7 to 11.

7. A chemical mechanical polishing method comprising polishing a copper film formed on a barrier metal film by using the chemical mechanical polishing aqueous dispersion according to claim 1.

* * * * *